United States Patent [19]

Glascock, II et al.

[11] Patent Number: 4,745,455

[45] Date of Patent: May 17, 1988

[54] SILICON PACKAGES FOR POWER SEMICONDUCTOR DEVICES

[75] Inventors: Homer H. Glascock, II; Harold F. Webster, both of Scotia; Constantine A. Neugebauer, Schenectady, all of N.Y.; Fadel A. Selim, Swarthmore, Pa.; David L. Mueller, Media, Pa.; Dante E. Piccone, Glenmoore, Pa.

[73] Assignee: General Electric Company, Schenectady, N.Y.

[21] Appl. No.: 863,761

[22] Filed: May 16, 1986

[51] Int. Cl.$^4$ .............................................. H01L 23/06
[52] U.S. Cl. ........................................ 357/74; 357/38; 357/67; 357/72; 357/79; 357/81; 361/386
[58] Field of Search ....................... 357/67, 74, 72, 73, 357/38, 79, 81; 174/52 S, 52 FP; 361/386, 388, 389

[56] References Cited

U.S. PATENT DOCUMENTS

| | | | |
|---|---|---|---|
| 3,354,258 | 11/1967 | Saia et al. ........................ | 357/74 X |
| 3,643,136 | 2/1972 | Tuft ..................................... | 357/74 |
| 3,688,018 | 8/1972 | Hiscocks ............................. | 357/74 |
| 3,721,867 | 3/1973 | Schierz ................................ | 357/74 |
| 3,925,808 | 12/1975 | Rai-Choudbury .................... | 357/67 |
| 3,986,201 | 10/1976 | Herold et al. ....................... | 357/74 X |
| 3,996,602 | 12/1976 | Goldberg et al. .................... | 357/74 |

Primary Examiner—G. P. Tolin
Assistant Examiner—H. L. Williams
Attorney, Agent, or Firm—Robert Ochis; James C. Davis, Jr.; Marvin Snyder

[57] ABSTRACT

A hermetically sealed package for a power semiconductor wafer is provided comprising substantially entirely silicon materials selected to have coefficients of thermal expansion closely matching that of the power semiconductor wafer. A semiconductor wafer such as a power diode comprises a layer of silicon material having first and second device regions on respective sides thereof. An electrically conductive cap and base, each including a layer of silicon material, are disposed in electrical contact with the first and second regions of the semiconductor device, respectively. An electrically insulative sidewall of silicon material surrounds the semiconductor wafer, is spaced from an edge thereof, and is bonded to the cap and base for hermetically sealing the package. An electrical passivant is disposed on an edge of the semiconductor wafer adjoining the first and second device regions for preventing electrical breakdown between the cap and base. An arc suppressant is disposed within the package between the semiconductor wafer edge and the sidewall for preventing electrical arcing between the base and cap.

45 Claims, 4 Drawing Sheets

SILICON PACKAGES FOR POWER SEMICONDUCTOR DEVICES

This invention relates generally to packaging, and more particularly to packages for semiconductor devices.

BACKGROUND OF THE INVENTION

Packages for power semiconductor wafers must operate in a variety of different environments and must meet many different requirements. Such packages must provide a housing for the wafer which is secure from external environmental influences which might otherwise damage the wafer. They must provide for electrical connections to the wafer in a manner which is both convenient and does not compromise the protection from the environment. They must provide a cool thermal environment for the wafer and must contact the wafer with materials which permit the wafer to expand and contract with changes in temperature, without causing excessive stresses in the wafer or supportive material. Such packages are also desirably light in weight, compact in size, and easily fabricated using known technologies.

Prior art packages for power semiconductor wafers typically comprise some combination of metals, plastics and ceramics, each of which compromises one aspect of functionality to emphasize another. For example, high thermal conductivity metals such as copper and aluminum can provide excellent heat removal characteristics, but differ substantially from the silicon wafer in thermal expansion. These metals thus cause thermal fatigue and premature failure at the interfaces between the wafer and package. Some ceramic materials may be selected to more closely match the thermal expansion of the wafer, but do not provide for easy electrical connection to the wafer. Some plastic materials may be easily fabricated into various package configurations, but these plastics may not provide for heat removal or electrical connections. In short, while various combinations and types of plastics, metals and ceramics can be used to fabricate packages with selected functional characteristics, each of these materials has its own drawbacks which makes its use in the package to some extent undesirable.

Accordingly, it would be desirable to provide a package for a power semiconductor wafer which provides a hermetic seal from the operating environment, simple electrical connection to the wafer, efficiency of cooling, thermal expansion similar to that of the wafer, low weight and compact size, and which may be fabricated using conventional technology.

OBJECTS OF THE INVENTION

A principal object of the present invention is to provide a new and improved, hermetically sealed package for a power semiconductor wafer, the package comprising substantially entirely silicon materials.

Another object of the present invention is to provide a hermetically sealed silicon package for a power semiconductor wafer which exhibits substantially the same thermal expansion as the semiconductor device.

A further object of the present invention is to provide a hermetically sealed silicon package for a power semiconductor wafer, the package providing a high coefficient of thermal conductivity and a large surface to volume ratio for efficient cooling.

Yet another object of the present invention is to provide a hermetically sealed silicon package for a power semiconductor wafer which is small in volume and light in weight.

A further object of the present invention is to provide a hermetically sealed silicon package for a power semiconductor wafer, the package being capable of fabrication using conventional manufacturing technologies.

SUMMARY OF THE INVENTION

A new and improved, hermetically sealed package for a power semiconductor wafer is provided comprising substantially entirely silicon materials selected to have coefficients of thermal expansion closely matching that of the power semiconductor wafer. In a preferred embodiment of the invention, the semiconductor wafer comprises a layer of silicon material having first and second device regions on respective sides thereof, such as a power diode. An electrically conductive cap and base, each including a layer of silicon material, are disposed in electrical contact with the first and second regions of the semiconductor device, respectively. An electrically insulative sidewall of silicon material surrounds the semiconductor wafer, is spaced from an edge thereof, and is bonded to the cap and base for hermetically sealing the package. An electrical passivant is disposed on an edge of the semiconductor wafer adjoining the first and second device regions for preventing electrical breakdown between the cap and base. An arc suppressant is disposed within the package between the semiconductor wafer edge and the sidewall for preventing electrical arcing between the base and cap.

Because the package materials are selected to match the coefficient of thermal expansion of the semiconductor wafer, the package does not suffer the problem of thermal fatigue commonly encountered in the prior art. Further, because the silicon materials have inherently high coefficients of thermal conductivity and the package structure has an inherently high surface-to-volume ratio, the package exhibits excellent heat-sink characteristics and provides an easy to cool thermal environment for the semiconductor wafer.

BRIEF DESCRIPTION OF THE DRAWINGS

While the specification concludes with claims defining the features of the invention that are regarded as novel, it is believed that the invention, together with further objects thereof, will be better understood from a consideration of the following description in conjunction with the drawing figures, in which:

DETAILED DESCRIPTION OF THE INVENTION

Figure 1:
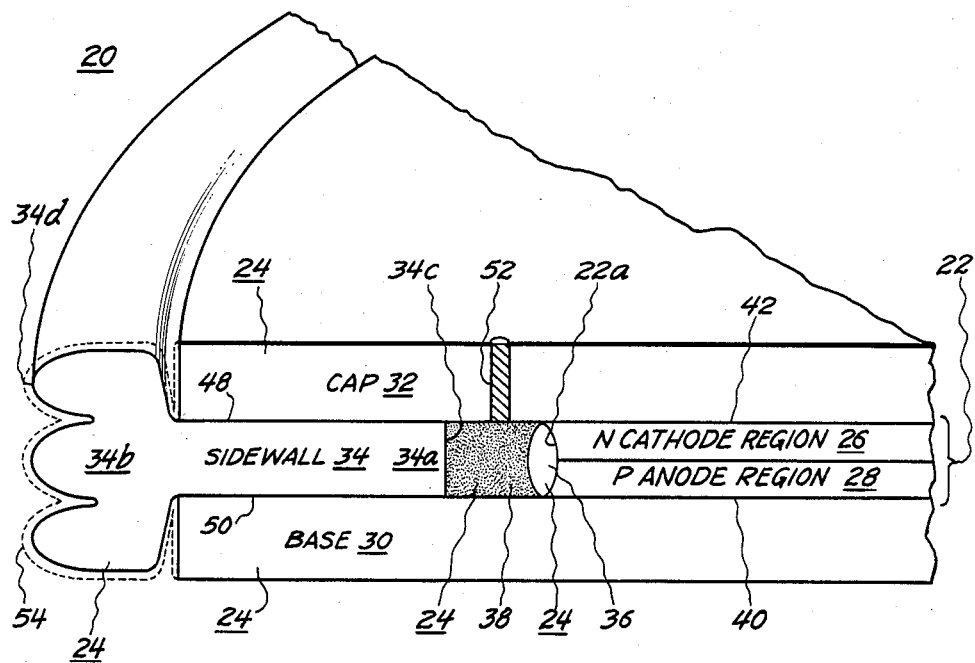
FIG. 1 is a partial cross-sectional view of a diode implemented in a package constructed in accordance with a first embodiment of the present invention.

Referring now to FIG. 1, a portion of a diode 20 includes a semiconductor wafer 22 in the form of a layer of silicon crystal material housed in a hermetically sealed, silicon package 24. Chip 22 includes an N-type cathode region 26 overlying a P-type anode region 28. In accordance with the present invention, package 24 includes an electrically conductive base 30, an electrically conductive cap 32, an electrically insulative sidewall 34, an electrical passivant 36 and an arc suppressant 38, each preferably comprising a silicon material. Base 30 comprises a layer of low-resistivity silicon material, preferably a highly-doped silicon, and is bonded to and disposed in electrical contact with anode region 28 of wafer 22 at a junction 40. Cap 32 also comprises a highly-doped, low-resistivity silicon, and is bonded to and disposed in electrical contact with cathode region 26 of wafer 22 at a junction 42. Cap 32 and base 30 each are preferably doped with P type dopants such as aluminum, boron or gallium, or N type dopants such as arsenic, phosphorous or antimony. The concentration of dopants is selected to provide cap 32 and base 30 with a low resistivity (on the order of 4 milli-ohm centimeters). Because cap 32 and base 30 each comprises silicon, each exhibits a coefficient of thermal expansion close in value to that of semiconductor wafer 22. Junctions 40 and 42 each comprise a lead alloy solder, an aluminum-silicon alloy solder, or a diffusion bond. A preferred lead alloy solder comprises, for example, an alloy of 92.5% lead, 5% tin and 2.5% silver. A preferred diffusion bond is formed, in a manner well known in the art, by (1) sputtering copper on the mating surfaces, and (2) holding these surfaces in intimate contact at a high temperature.

Sidewall 34 includes a layer portion 34a disposed between base 30 and cap 32 and an outer portion 34b surrounding package 24. Sidewall layer portion 34a surrounds wafer 22, includes an edge 34c spaced apart from an edge 22a of the wafer, and is bonded to cap 32 at a junction 48, and base 30 at a junction 50, so as to hermetically seal package 24. Sidewall outer portion 34b includes a three-lobed edge 34d surrounding the outside of package 24 and adjoining base 30 and cap 32. Sidewall 34 comprises pre-molded silicon glass selected to have a coefficient of thermal expansion close to that of silicon wafer 22. As is known to those skilled in the art, the coefficient of thermal expansion of silicon glass is controlled by selecting the quantity of additives, such as boron oxide ($B_2O_3$) or sodium monoxide ($Na_2O$), which are added to the silicon glass. Junctions 48 and 50 are preferably formed using the solders or diffusion bond described above with respect to junctions 40 and 42, or by the use of glass frits.

Passivant 36 is fabricated directly on edge 22a of wafer 22, and preferably comprises a polyimide, a silicon room-temperature vulcanizing rubber (RTV), or amorphous silicon. Arc suppressant 38, preferably comprising alumina ($Al_2O_3$), silicon dioxide ($SiO_2$), or RTV, is disposed within package 24 between sidewall layer edge 34c and wafer edge 22. An aperture 52, shown sealed with a low temperature lead-tin eutectic, is disposed in cap 32 for inserting arc suppressant 38 into package 24.

In use, cap 32 serves as a cathode contact for diode 20, while base 30 serves as an anode contact for the diode. External electrical leads (not shown) are soldered directly to cap 32 or base 30, as required. Passivant 36 functions to control the electric field developed across the junction between cathode region 26 and anode region 28, thereby preventing electrical breakdown between cap 32 and base 30. Arc suppressant 38 functions to suppress arcing between cap 32 and base 30. Lobed edge 34d of outer sidewall portion 34b functions to increase the length of the current creep path, indicated by dashed line 54, between cap 32 and base 30 along the outside edge of the package. It will be appreciated that the shape of lobed edge 34b is only important in so far as it increases the length of current creep path 54. It will be further appreciated that those components of package 24 which don't necessarily comprise silicon materials (i.e., the bonds at junctions 40, 42, 48 and 50, passivant 36 and arc suppressant 38) include only a small percentage by volume of the package and therefore don't noticeably affect the functional characteristics of the package.

There is thus provided a hermetically sealed, compact semiconductor package 24 comprising substantially entirely silicon materials having coefficients of thermal expansion close in value to that of semiconductor wafer 22. Package 24, due to the nature of its structure, exhibits a high ratio of surface area to volume. This ratio, combined with the good thermal conductivity of the silicon package components, makes package 24 efficient to cool. Further, the package can be constructed using conventional semiconductor manufacturing techniques.

Figure 2:
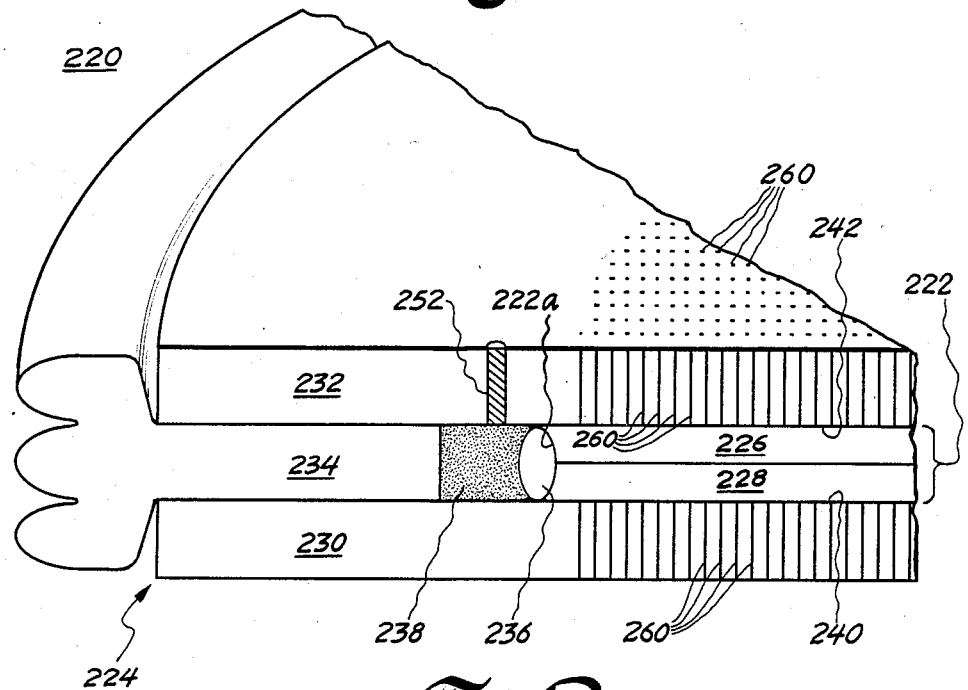
FIG. 2 is a partial cross-sectional view of a diode implemented in a package constructed in accordance with a second embodiment of the present invention.
Figure 2A:
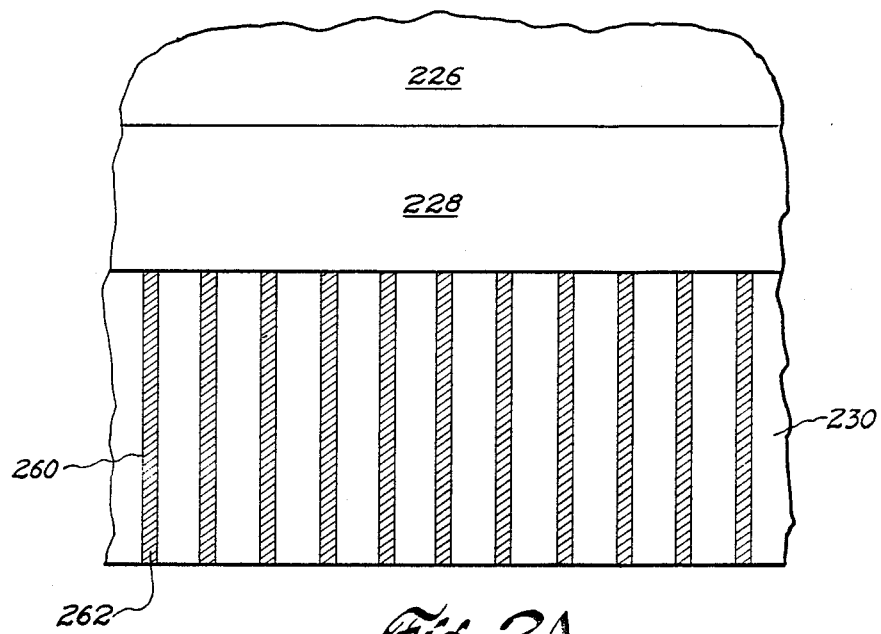
FIG. 2A is an enlarged view of a portion of FIG. 2, illustrating selected details thereof.

Referring now to FIGS. 2 and 2A, a diode 220 is shown wherein features similar to those of FIG. 1 retain like reference numerals incremented by 200. Diode 220 is substantially identical in structure to diode 20 of FIG. 1 with the exception of the construction of cap 232 and base 230. In this second embodiment of the invention, cap 232 and base 230 each comprise a high-purity, high-resistivity silicon material including a plurality of vias 260 extending vertically (with respect to the view shown in FIGS. 2 and 2A) therethrough and into contact with cathode and anode regions 226 and 228, respectively. Each via 260 is filled with a conductive material 262, preferably comprising either an aluminum-silicon alloy, lead, or copper. In one exemplary embodiment of the invention, vias 260 are fabricated to provide approximately 6 mil diameter holes located on 50 mil centers.

In use, the high-purity, high-resistivity silicon material comprising cap 232 and base 230 typically exhibits a higher coefficient of thermal conductivity than the highly-doped, low-resistivity silicon cap 30 and base 29 of FIG. 1, providing package 220 with exceptionally good thermal conductivity. The conductive-material-filled vias 260 provide cap 232 and base 230 with very low electrical resistivity, i.e., on the order of 3 milli-ohm centimeters or less. Further, because conductive material 262 is small in volume in comparison to the volumes of cap 232 and base 230, package 224 still comprises substantially entirely silicon, and base 230 and cap 232 still retain substantially the same coefficient of thermal expansion as that of wafer 222.

Figure 3:
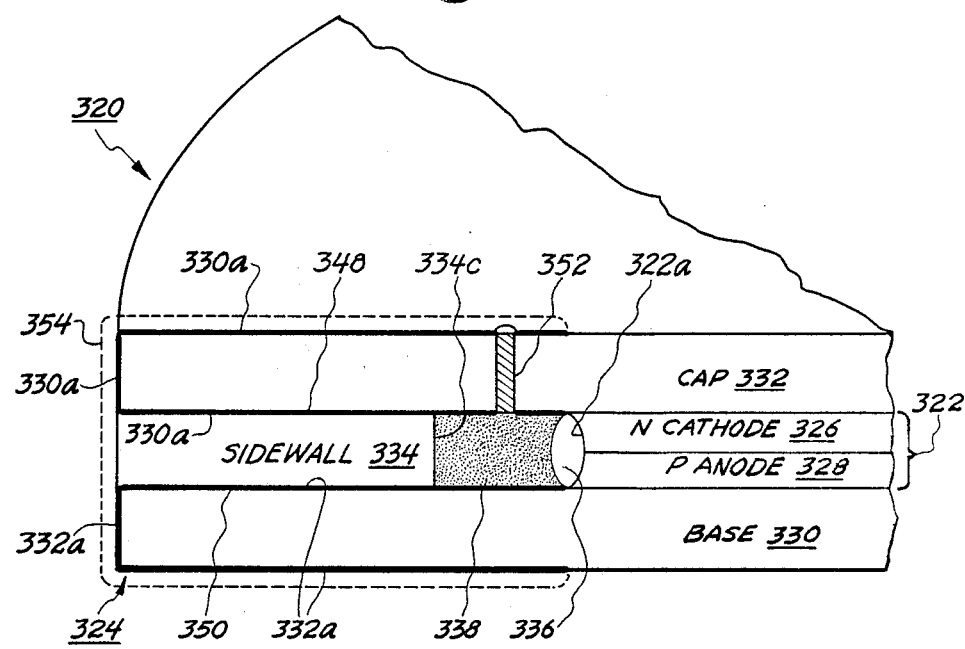
FIG. 3 is a partial cross-sectional view of a diode implemented in a package constructed in accordance with a third embodiment of the present invention.

Referring now to FIG. 3, a portion of a diode 320 is shown wherein features similar to those of FIG. 1 retain like reference numerals incremented by 300. Diode 320 is substantially identical in structure to diode 20 of FIG.

1, with the exception of the construction of sidewall 334 and the inclusion of an insulating layer on cap 332 and base 330, the insulating layer being indicated at 332a and 330a, respectively.

Figure 3A:
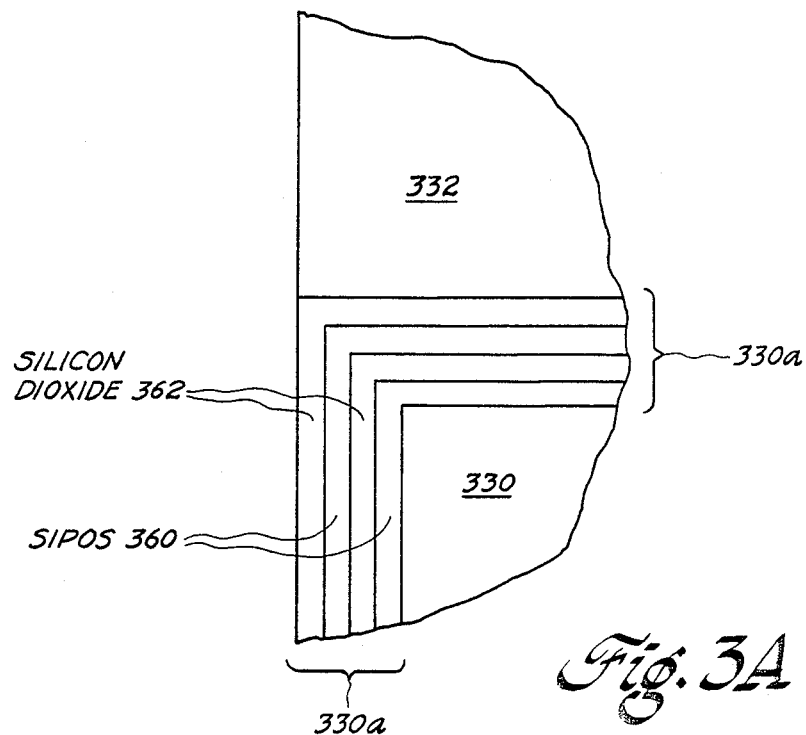
FIG. 3A is an enlarged view of a portion of FIG. 3 illustrating selected details thereof.

In accordance with the present embodiment of the invention, sideswall 334 comprises a layer of high-purity, high-resistivity silicon hermetically bonded to cap 332 at junction 348 and to base 330 at junction 350. An electrically insulative coating is disposed on the surface of the portions of cap 332 and base 330 extending outward beyond edge 322a of wafer 322, this coating being indicated at 330a and 332a, respectively. As shown in detail in FIG. 3A, insulative coatings 330a and 332a (only 330a being shown in FIG. 3A) each comprise alternating layers of semi-insulating polyoxygenated silicon (SIPOS) 360 and silicon dioxide ($SiO_2$) 362. Junctions 348 and 350 are preferably formed using the solders, diffusion bonds or glass frits described hereinabove with respect to junctions 48 and 50.

In use, in a manner similar to lobed edge 34d of package 24 (FIG. 1), coatings 330a and 332a function to increase the distance of leakage current creep path 354 between base 330 and cap 332. The use of this insulative coating (versus the glass lobed edge) provides a more compact package. The use of high-purity silicon sidewall 334 (versus glass sidewall 34 of FIG. 1) provides a semiconductor package having a coefficient of thermal expansion closer in value to that of wafer 322.

Figure 4:
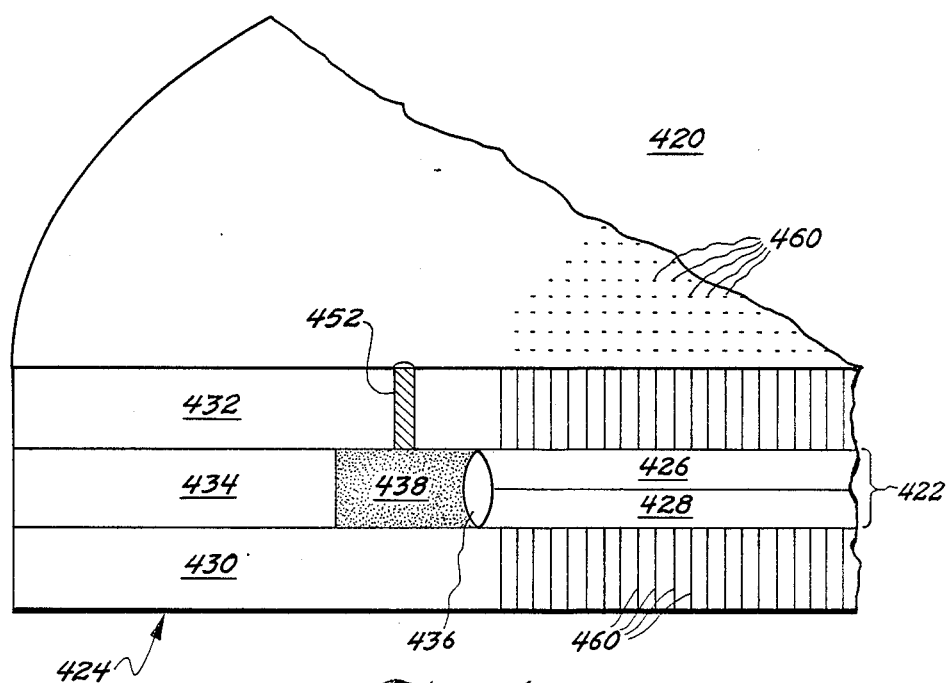
FIG. 4 is a partial cross-sectional view of a diode implemented in a package constructed in accordance with a fourth embodiment of the present invention.

Referring now to FIG. 4, a diode 420 is shown wherein features similar to those of FIG. 3 retain like reference numerals incremented by 100. Diode 420 is substantially identical to diode 320 of FIG. 3 with the exception of the construction of cap 432 and base 430. In accordance with the present embodiment of the invention, cap 432 and base 430 are constructed substantially identically to cap 232 and base 230, respectively, of FIGS. 2 and 2A. Cap 432 and base 430 each comprise high-purity, high-resistivity silicon, and each includes a plurality of vias 460 extending vertically therethrough into contact with cathode and anode regions 426 and 428, respectively. As described with respect to FIGS. 2 and 2A above, each via 460 is filled with an electrically conductive material (not shown in detail in FIG. 4) comprising either an aluminum-silicon alloy, lead, or copper. Because base 430 and cap 432 comprise high resistivity silicon, no insulative coating is required on their surfaces to provide a long leakage current creep path. In use, the package shown and described in this embodiment of the invention provides the advantages of: compact size because side-lobes are not required on the sidewall, good thermal conductivity provided by the high-purity silicon cap, base and sidewall, and ease of construction because an insulative coating is not required on the cap and base.

Figure 5:
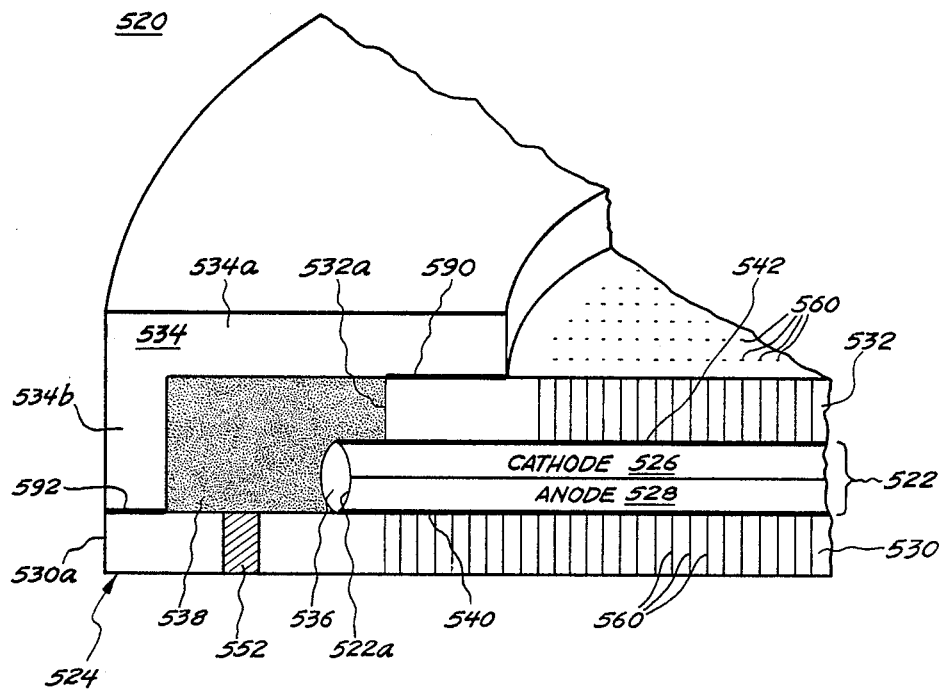
FIG. 5 is a partial cross-sectional view of a diode implemented in a package constructed in accordance with a fifth embodiment of the present invention.

Referring now to another embodiment of the invention illustrated in FIG. 5, a portion of a diode 520 is shown wherein features identical to those of FIG. 2 are indicated by like reference numerals incremented by 300. Diode 520 is substantially identical in structure to diode 220 of FIG. 2 with the exception of the construction of sidewall 534 and its disposition on cap 532 and base 530.

In accordance with the present embodiment of the invention, base 530 includes an edge 530a which extends laterally past an edge 522a of wafer 522. Edge 522a in turn extends laterally past an edge 532a of cap 532. Sidewall 534 comprises a layer of pre-molded silicon glass of the type described above, having a generally L-shaped cross-section including a leg 534a bonded to cap 532 at a junction 590 and a leg 534b bonded to base 530 at a junction 592, junctions 590 and 592 preferably being formed using the solders, diffusion bonds or glass frits described hereinabove. In use, package 524 represents an alternative construction of package 224 (FIG. 2), and functions in a substantially identical manner.

In summary, multiple embodiments of a hermetically sealed, substantially all-silicon package for a semiconductor wafer are provided. Each embodiment is light in weight, compact in size, and provides a good thermal environment for the wafer. Further, each embodiment can be fabricated using known manufacturing technologies.

While preferred embodiments of the invention ahve been illustrated and described, it will be clear that the invention is not so limited. For example, while the embodiments of the invention have been described with respect to a diode, it will be appreciated that it is equally applicable to other devices such as silicon controlled rectifiers (SCR's). Numerous modifications, changes, variations, substitutions and equivalents will occur to those skilled in the art without departing from the spirit and scope of the present invention. Accordingly, it is intended that the invention herein be limited only by the scope of the appended claims.

What is claimed is:

1. A hermetically sealed package having a silicon semiconductor wafer power device sealed therein; said semiconductor wafer comprising a layer of silicon material having first and second device regions on respective sides thereof; said package comprising:
   an electrically conductive silicon base bonded to said wafer in ohmic electrical contact with said first device region;
   an electrically conductive silicon cap bonded to said wafer in ohmic electrical contact with said second device region;
   an electrically insulative sidewall of silicon material surrounding said semiconductor wafer spaced from an edge thereof, said sidewall bonded to said silicon base and said silicon cap, said sidewall, base and cap together forming the hermetically sealed enclosure of said package;
   an electrical passivant disposed on said edge of said semiconductor wafer and adjoining said first and second device regions; and
   an arc suppressant disposed within said package and conforming to and substantially completely filling said space between said electrical passivant and said sidewall.

2. The package of claim 1 wherein said electrical passivant comprises a polyimide, a silicone room-temperature vulcanizing rubber (RTV), or amorphous silicon.

3. The package of claim 1 wherein said arc suppressant comprises alumina ($Al_2O_3$), silicon dioxide ($SiO_2$), or a silicone room-temperature vulcanizing rubber (RTV).

4. The package of claim 1 wherein said base and cap are each fastened to said first and second device regions, respectively, with a bond comprising a solder or a diffusion bond.

5. The package of claim 4 wherein said solder comprises a lead alloy or an aluminum-silicon alloy.

6. The package of claim 4 wherein said diffusion bond comprises copper.

7. The package of claim 1 wherein said sidewall is hermetically bonded to said cap and said base with a bond comprising a solder, a diffusion bond, or glass frits.

8. The package of claim 7 wherein said solder comprises a lead alloy or an aluminum-silicon alloy.

9. The package of claim 7 wherein said diffusion bond comprises copper.

10. The package of claim 1 and further including an aperture in said package communicating with the gap between said sidewall and said semiconductor wafer edge for inserting said arc suppressant into said package.

11. The package of claim 1 further comprising a passageway extending between an external surface of said package and said arc-suppressant-filled space, said passageway itself being hermetically sealed to complete said hermetically sealed enclosure of said wafer in said package.

12. The package of claim 11 wherein said passageway is sealed with solder.

13. The package of claim 11 wherein said silicon base and said silicon cap both have substantially planar exterior surfaces and said passageway extends through either said silicon base or said silicon cap and said passageway is sealed by material which does not extend outward beyond the plane of said exterior surface of said base or cap, respectively.

14. A hermetically sealed package having a silicon semiconductor wafer power device sealed therein; said semiconductor wafer comprising a layer of silicon material having first and second device regions on respective sides thereof; said package comprising:
an electrically conductive silicon base bonded to said wafer in ohmic electrical contact with said first device region;
an electrically conductive silicon cap bonded to said wafer in ohmic electrical contact with said second device region;
an electrically insulative sidewall of pre-molded silicon glass surrounding said semiconductor wafer and spaced from an edge thereof, said sidewall bonded to said silicon base and said silicon cap, said sidewall, base and cap together forming the hermetically sealed enclosure of said package, said glass selected to have a coefficient of thermal expansion close in value to that of said semiconductor wafer;
an electrical passivant disposed on said edge of said semiconductor wafer and adjoining said first and second device regions; and
an arc suppressant disposed within said package in said space between said electrical passivant and said sidewall and conforming to and substantially filling said space between said electrical passivant and said sidewall.

15. The package of claim 14 wherein said electrical passivant comprises a polyimide, room-temperature vulcanizing rubber (RTV), or amorphous silicon.

16. The package of claim 14 wherein said arc suppressant comprises alumina ($Al_2O_3$), silicon dioxide ($SiO_2$), or room-temperature vulcanizing rubber (RTV).

17. The package of claim 14 wherein said sidewall comprises a layer portion disposed between said cap and base and an edge portion extending outward beyond said cap and base and adapted for increasing the length of the leakage current creep path between said cap and said base.

18. The package of claim 14 wherein said cap and base each comprise highly-doped, low-resistivity silicon.

19. The package of claim 14 wherein said cap and base are doped with a dopant comprising aluminum (Al) or boron (B) or gallium (Ga) or arsenic (As) or phosphorous (P) or antimony (An).

20. The package of claim 14 wherein said cap and base each comprise high-purity, high-resistivity silicon including a plurality of vias extending therethrough, each of said vias filled with an electrically conductive material.

21. The package of claim 20 wherein said electrically conductive material comprises copper, lead (Pb) or an alloy of aluminum and silicon.

22. The package of claim 20 wherein:
said semiconductor wafer edge extends past the edge of said cap;
the edge of said base extends past said semiconductor wafer edge; and
said sidewall has a generally L-shaped cross-section including one leg disposed in contact with said base and the other leg disposed in contact with said cap.

23. A hermetically sealed package having a silicon semiconductor wafer power device sealed therein; said semiconductor wafer comprising a layer of silicon material having first and second device regions on respective sides thereof; said package comprising:
an electrically conductive silicon base bonded to said wafer in ohmic electrical contact with said first device region;
an electrically conductive silicon cap bonded to said wafer in ohmic electrical contact with said second device region;
an electrically insulative sidewall of high-purity, high-resistivity silicon surrounding said semiconductor wafer and spaced from an edge thereof, said sidewall bonded to said silicon base and said silicon cap, said sidewall, base and cap together forming the hermetically sealed enclosure of said package;
an electrical passivant disposed on said edge of said semiconductor wafer and adjoining said first and second device regions; and
an arc suppressant disposed within said package in said space between said electrical passivant and said sidewall and conforming to and substantially completely filling said space.

24. The package of claim 23 wherein said electrical passivant comprises a polyimide, a silicone roomtemperature vulcanizing rubber (RTV), or amorphous silicon.

25. The package of claim 23 wherein said arc suppressant comprises alumina ($Al_2O_3$), silicon dioxide ($SiO_2$), or room-temperature vulcanizing rubber (RTV).

26. The package of claim 23 wherein:
said cap and base each comprise highly-doped, low-resistivity silicon; and
an insulative coating is disposed on the surface of the portions of said cap and base situated between said semiconductor wafer edge and the edge of said semiconductor package for increasing the leakage current creep path between said cap and said base.

27. The package of claim 26 wherein said insulative coating comprises alternate layers of semi-insulating polyoxygenated silicon (SIPOS) and silicon dioxide ($SiO_2$).

28. The package of claim 23 wherein said cap and base each comprise high-purity, high-resistivity silicon including a plurality of vias extending therethrough, each of said vias filled with an electrically conductive material.

29. The package of claim 28 wherein aid electrically conductive material comprises copper, lead (Pb) or an alloy of aluminum and silicon.

30. The package of claim 23 further comprising a passageway extending between an external surface of said package and said arc-suppressant-filled space, said passageway itself being hermetically sealed to complete said hermetically sealed enclosure of said wafer in said package.

31. The package of claim 30 wherein said passageway is sealed with solder.

32. The package of claim 30 wherein said silicon base and said silicon cap both have substantially planar exterior surfaces and said passageway extends through either said silicon base or said silicon cap and said passageway is sealed by material which does not extend outward beyond the plane of said exterior surface of said base or cap, respectively.

33. A sealed package having a silicon semiconductor power device wafer sealed therein comprising:
electrically conductive silicon terminal layers bonded to said wafer in ohmic electrical contact with opposed major planar surfaces of said wafer, said layers overhanging the periphery of said wafer to form a peripheral channel intermediate said layers and outboard of said wafer, and
an electrically insulative silicon sidewall located in said channel and bonded to said layers to form in cooperation therewith the enclosure of said package in which said wafer is sealed.

34. The package recited in claim 33 wherein said sidewall comprises a silicon glass material.

35. The package recited in claim 34 wherein said silicon glass material has a thermal coefficient of expansion substantially the same as that of said wafer.

36. The package recited in claim 33 further including an electrical passivant disposed on the edges of said wafer in said channel.

37. The package recited in claim 33 further including an arc suppressant disposed in said channel intermediate said wafer and said sidewall.

38. The package recited in claim 37 wherein one of said layers includes an opening communicating with said channel for inserting said arc suppressant into said channel.

39. The package of claim 37 further comprising a passageway extending between an external surface of said package and said arc-suppressant-filled space, said passageway itself being hermetically sealed to complete said hermetically sealed enclosure of said wafer in said package.

40. The package of claim 39 wherein said passageway is sealed with solder.

41. The package of claim 39 wherein said silicon base and said silicon cap both have substantially planar exterior surfaces and said passageway extends through either said silicon base or said silicon cap and said passageway is sealed by material which does not extend outward beyond the plane of said exterior surface of said base or cap, respectively.

42. The package recited in claim 33 wherein said layers are bonded to said wafer with a bond comprising a solder or a diffusion bond.

43. The package recited in claim 33 wherein within said channel said sidewall has substantially the same thickness as said wafer.

44. The package recited in claim 43 wherein:
said sidewall is pre-molded.

45. The package recited in claim 33 wherein:
said sidewall is pre-molded.

* * * * *